United States Patent [19]
Eckardt et al.

[11] Patent Number: 4,712,064
[45] Date of Patent: Dec. 8, 1987

[54] MAGNETORESISTIVE SENSOR FOR DETECTING POSITION OR SPEED OF A FERROMAGNETIC BODY

[75] Inventors: Dieter Eckardt, Nuremberg; Gerhard Hettich, Rosstal, both of Fed. Rep. of Germany

[73] Assignee: Robert Bosch GmbH, Stuttgart, Fed. Rep. of Germany

[21] Appl. No.: 852,629
[22] PCT Filed: Apr. 25, 1985
[86] PCT No.: PCT/DE85/00132
 § 371 Date: Feb. 26, 1986
 § 102(e) Date: Feb. 26, 1986
[87] PCT Pub. No.: WO86/00877
 PCT Pub. Date: Feb. 13, 1986

[30] Foreign Application Priority Data

Jul. 20, 1984 [DE] Fed. Rep. of Germany ....... 3426784

[51] Int. Cl.⁴ ...................... G01B 7/14; G01R 33/02; H01L 43/00
[52] U.S. Cl. .................................... 324/208; 324/252; 338/32 R
[58] Field of Search ............... 324/207, 208, 252, 173, 324/174; 338/32 R

[56] References Cited
U.S. PATENT DOCUMENTS 4,039,936  8/1977  Jones et al. .......................... 324/208
4,361,805 11/1982  Narimatsu et al. .................. 324/252
4,429,276  1/1984  Narimatsu et al. .................. 324/207

Primary Examiner—Reinhard J. Eisenzopf
Assistant Examiner—Walter E. Snow
Attorney, Agent, or Firm—Michael J. Striker

[57] ABSTRACT

A magnetoresistive sensor used for emitting of electric signals in dependency on the position or the speed of a ferromagnetic body includes magnetoresistive measuring strips (10) on a substrate (12) which are exposed to a stationary magnetic field (H) such that a large field component ($H_y$) extends perpendicular to the measuring strips and a substantially smaller field component ($H_x$) in the plane of the measuring strips and at an angle of about 45° to the direction of a measuring current flowing through the measuring strips. By approaching a ferromagnetic body (14) to the stationary field (H) additional field components ($H_z$ and $H_t$) start acting on the measuring strips. The magnetic field component $H_t$ generated in the plane of the measuring strips changes in dependency on the position or speed of the ferromagnetic body and affects measuring current accordingly.

16 Claims, 10 Drawing Figures

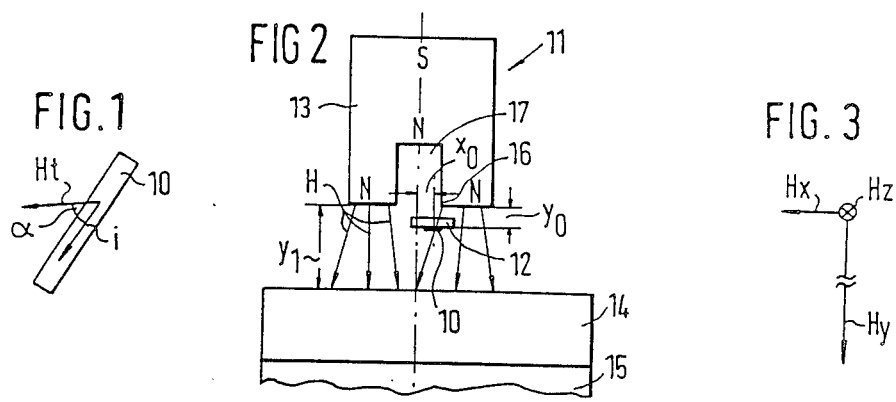
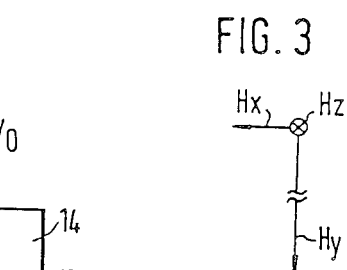
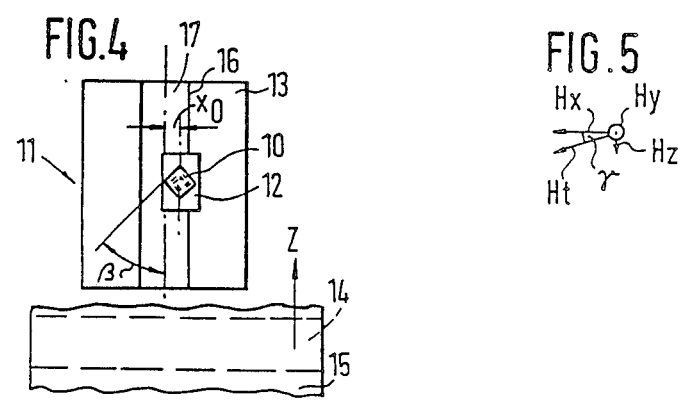
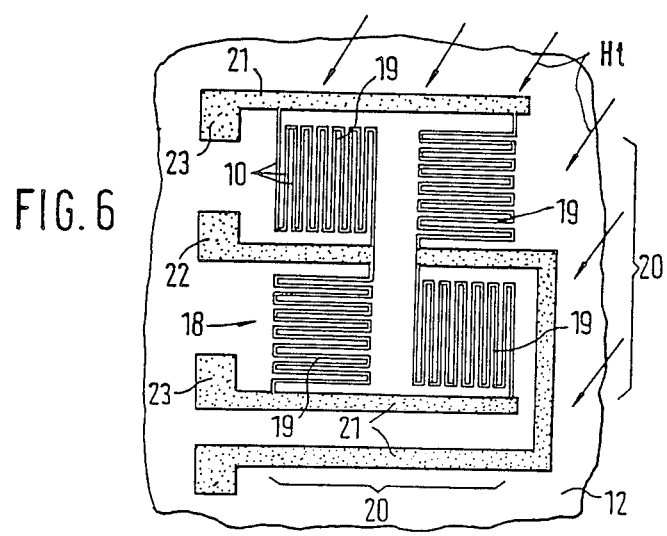

MAGNETORESISTIVE SENSOR FOR DETECTING POSITION OR SPEED OF A FERROMAGNETIC BODY

STATE OF THE ART

The invention is based on a magnetoresistive sensor for emitting electric signals. It is known to use reading heads for scanning magnetic tapes, wherein magnetoresistive measuring strips are provided perpendicular with respect to the magnetic tape through which a measuring current flows. The information which is stored on the magnetic tape consists of small magnetic fields which are disposed in the plane of the magnetoresistive measuring strip and influence the direction of magnetisation in the measuring strip during the passing movement. The resistor of the measuring strip is changed by the magnetic field component which is disposed in the plane of the measuring strip and forms an angle with the direction of the current in the measuring strip. Since the measuring strip is switched through a preresistor to direct voltage, the voltage drop on the measuring strip changes with the resistor being evaluated as a measuring signal (Philips Technische Rundschau 37,1977/78, No. 2/3, page 47 ff). This solution is disadvantageous in that it can be used for scanning weak magnetic fields only which must be applied to a moving carrier. Such a solution principle is unsuitable for a number of sensor applications wherein magnetic fields or magnetic field changes should be detected, because the magnetic tape or another magnetic field carrier must be moved by the reading head practically without an air slot. Moreover, interference fields can falsify the measuring result on the reading head or on the magnetic tape or change the magnetic fields to be detected.

It is an object of the subject solution to provide a magnetoresistive sensor which is stationary mounted and which is substantially insensitive against interference fields as well as against changes and tolerances in the air space between the stationary sensor and a body to be detected.

The inventive solution is advantageous in that the body to be moved passed the sensor does not have to be provided with permanent magnetic fields any longer, but that instead a strong stationary uniform magnetic field penetrates the magnetoresistive measuring strips in such a manner so that the body to be detected is magnetizised by a large component of the uniform field which penetrates perpendicular through the measuring strip, and that a magnetic saturation is obtained in the measuring strip by a magnetic field component which is disposed in the plane of the measuring strip, so that only the change in direction of this magnetic field component causes a voltage change on the measuring strip by means of the ferromagnetic body and interference influences are suppressed. In contrast to known inductive sensors this solution has the advantage that with a static operation, that is, with a shut-down ferromagnetic body its position in the area of the magnetoresistive sensor may be determined. Furthermore, in contrast to the inductive sensors a substantially larger air slot is permissible and no frequency dependent phase frequency characteristic occurs. The sensor in accordance with the invention is substantially less sensitive with respect to vibrations or axial impact of the spur gear than known inductive speed sensors when being used as a speed sensor.

It is particularly advantageous to provide the substrate with the magnetoresistive measuring strip on the front side of a permanent magnet in the area of an edge on the permanent magnet when the ferromagnetic body, preferably a rotating spur gear, moves at a distance along the edge for emitting a speed signal at the output of the sensor. It has been shown to be advantageous to form the edge on the permanent magnet by a groove extending over the total front face of the permanent magnet in the movement direction of the ferromagnetic body or the spur gear for forming a homogenic magnetic field with a magnetic field component which is vertical and horizontal with respect to the measuring strip.

Three exemplified embodiments of the invention are illustrated in the drawings and explained in detail in the following description. The drawings illustrate in FIG. 1 a measuring strip of the magnetoresistive sensor, FIG. 2 a magnetoresistive sensor with a permanent magnet and a rotating soft magnetic body, FIG. 3 illustrates the components of the magnetic field in the area of the measuring strip of the sensor in accordance with FIG. 2, FIG. 4 illustrates the sensor in accordance with FIG. 2 in a view from below, FIG. 5 illustrates the components of the magnetic field in the plane of the measuring strip, FIG. 6 illustrates the measuring strip of the sensor mounted on a substrate in an exaggerated enlarged illustration and;

DESCRIPTION OF THE EXEMPLIFIED EMBODIMENTS

Figure 7:
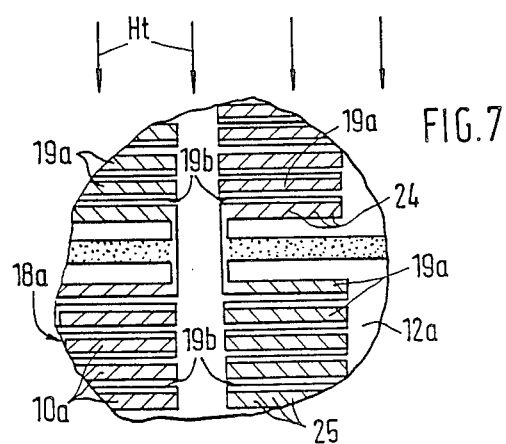
FIG. 7 illustrates another arrangement of the measuring strip in a second exemplified embodiment.

A single measuring strip 10 is illustrated in FIG. 1 from a plurality of measuring strips of a magnetoresistive sensor. A measuring current i is fed in longitudinal direction through the measuring strip which is disposed in the drawing plane for generating a measuring signal. The resistance of the measuring strip 10 reduces when applying a magnetic field which has a so-called tangential component Ht in the plane of the measuring strip 10 and forms an angle $\alpha$ in the direction of the current i. If the field component Ht is large enough to magnetically saturate the measuring strip 10, a change of the resistance in the measuring strip 10 is caused only by the change of direction of the field component Ht. The largest resistor change is obtained in that the field component Ht at first forms an angle $\alpha = 45°$ in a basic setting with the direction of current i. In this basic setting the gradient $(dR/d\alpha)$ of the characteristic curve for the resistor change is maximal, so that already the smallest changes in direction of the field component Ht of less than 1° can be picked up by a corresponding evaluation circuit as well as by switching together a plurality of such measuring strips 10.

FIGS. 2 and 4 illustrates a magnetoresistive sensor 11, whereby a plurality of measuring strips 10, indicated in FIG. 4, are mounted on a substrate 12. As illustrated in FIG. 2, the substrate 12 is stationary mounted with a superimposed permanent magnet 13, whereby the permanent magnet 13 is magnetized in perpendicular direction. A soft magnetic body is mounted below substrate 12 which is formed by a tooth 14 of a rotating wheel 15. The longitudinal side of tooth 14 can be seen in FIG. 2. The substrate 12 with the measuring strip 10 on the lower front face of the permanent magnet 13 is provided in the area of an edge 16 of permanent magnet 13 which is formed by a groove 17. Groove 17 extends over the total front face of permanent magnet 13 in the direction of movement Z (FIG. 4) of tooth 14. The magnet field H which emits on the lower front face of the permanent magnet 13 is not homogeneous over the total width of the permanent magnet 13 due to the groove 17. Thereby, the measuring strips 10 on the substrate 12 are obliquely penetrated on substrate 12 by the magnetic field H. FIG. 3 illustrates that thereby a large field component Hy extends perpendicular to the measuring strips 10 and a substantially smaller field component Hx in the plane of measuring strips 10.

The magnetoresistive sensor 11 is illustrated in FIG. 4 with a view to the lower front face of permanent magnet 13. Thereby, it can be seen that the measuring strips 10 form an angle $\beta = 45°$ with respect to the longitudinal axis of permanent magnet 13. FIG. 5 illustrates the field component Ht which is effective in the plane of measuring strips 10, resulting from field component Hx transversely to groove 17 and the field component Hz in direction of groove 17. The main component Hy of the magnetic field H is disposed perpendicular to the plane of the drawing.

Since the substrate 12 with the measuring strips 10 is mounted on the front face of permanent magnet 10 on a half length of groove 17, the field component Ht which is effective in the plane of measuring strips 10 is identical with the field component Hx of magnetic field H directed transversely to the groove, as long as tooth 14 of wheel 15 does not approach sensor 11. In this case the dimension of angle $\alpha = \beta = 45°$. The field component Hz which can be seen in FIG. 5 is not yet present, so that Hx=Ht. As soon as, as illustrated in FIG. 4, the recognizeable dotted line tooth 14 of wheel 15 approaches in direction Z to sensor 11, the magnetic field H of the permanent magnet 13 is deflected from this tooth 14 and a field component Hz is added in accordance with FIG. 5, whereby the direction of the field component Ht being in the plane of measuring strips 10 changes by the angle $\gamma$. Depending on the position of measuring strips 10 the angle (FIG. 1) becomes larger or smaller. This results in the equation:

$\alpha = \beta \pm \gamma$.

When the tooth 14 is now moved by sensor 11 in the direction Z, the field component Hz becomes at first larger. When the tooth 14 reaches the center of sensor 11, the field component Hz again disappears. Subsequently it increases again in the opposite direction and again disappears after the tooth 14 leaves sensor 11. A particularly pronounced change of direction of the field component Ht results in a sensor 11, wherein the distance of the measuring strips 10 from the front face of the permanent magnet 13 is $y_0 \approx 1.5$ mm and wherein the distance $y_1$ of the lower front face of the permanent magnet 13 to tooth 14 is about 2 to 6 mm. Thus, the distance $y_0$ is selected smaller than the distance $y_1 - y_0$ between the tooth 14 and the measuring strip 10. Moreover, the distance of the geometric center of all measuring strips 10 from the center axis of the permanent magnet 13 should be $x_0 \approx 1.5$ mm, and the groove 17 should be about 3 mm wide and $\approx 7$ mm deep.

In order to obtain a possible large measuring voltage on sensor 11 by moving tooth 14 passed the sensor, the measuring strips 10 are connected with each other to a bridge circuit 18 with four resistors 19, which is illustrated in FIG. 6 in an exaggerated large scale. Thereby, the adjacent disposed measuring strips 10 of each resistor 19 of bridge circuit 18 are switched meander like in series. The resistors 19 are mounted on one each square area 20 of the substrate 12 in one each of the four quadrants. Due to the tight spatial arrrangement it is achieved that in this area 20 a substantially homogenic field density is present in the area of the resistors 19 for the field component Ht being disposed in the plane of measuring strips 10. The ends of the resistors 19 are contacted with conductors 21 on the ends of which contact faces 22 and 23 are formed. The contact faces 22 are used for the voltage supply of the bridge circuit 18 by applying a direct current, while the contact faces 23 are used for picking up a measuring voltage on the bridge diagonal. A relative large measuring voltage is obtained on a bridge circuit when the diagonally opposed resistors of the bridge circuit change in the same direction and the resistors which are disposed in the same bridge branch change in the opposite direction. In the bridge circuit 18 of sensor 11 this is achieved by the field component Ht, in that the measuring strips 10 of each resistor 19 are turned by 90° in their longitudinal direction with respect to the measuring strips of the adjacent resistors. In such an arrangement of the measuring strips 10, as illustrated in FIG. 6, a measuring voltage is obtained during the moving of tooth 14 passed sensor 11 which is independent from the rotating speed of the tooth, whereby this measuring voltage with an applied direct voltage is from Ua=10 V to $\Delta U = 200$ mV.

A broken away section from the bridge circuit 18a is illustrated in FIG. 7 in a further exemplified embodiment of sensor 11, wherein the resistors 19a on substrate 12a consist of meander like adjacent disposed measuring strips 10a being switched successively, whose longitudinal direction is uniform with the measuring strips 10a of the adjacent resistors 19. However, in this case the measuring strips 10a are connected with each other with electrically well conducting gold conductors 19b and are separated into individual conductor segments by gold threads 24. The threads 24 are mounted in an angle of 45° with respect to the longitudinal direction of the measuring strips 10. The current which flows through measuring strips 10 is turned by about 45° from the longitudinal direction by threads 24. Such arrangements are known under the name Barber-Poles in sound heads. In order to also achieve an opposite resistor change in the resistors of a bridge branch for the field component Ht which is disposed in the plane of measuring strips 10a, the threads 24 extend on the measuring strip 10a of each resistor 18a of the bridge circuit 19a in a turned manner by 90° with respect to the threads 24 of adjacent resistors 19a.

Figure 8:
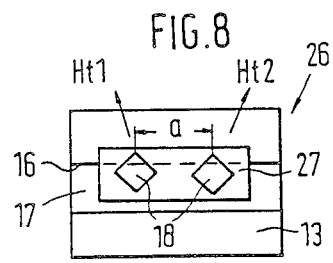
FIG. 8 illustrates a magnetoresistive sensor with two bridge circuits of measuring strips in a third exemplified embodiment.
Figure 9:
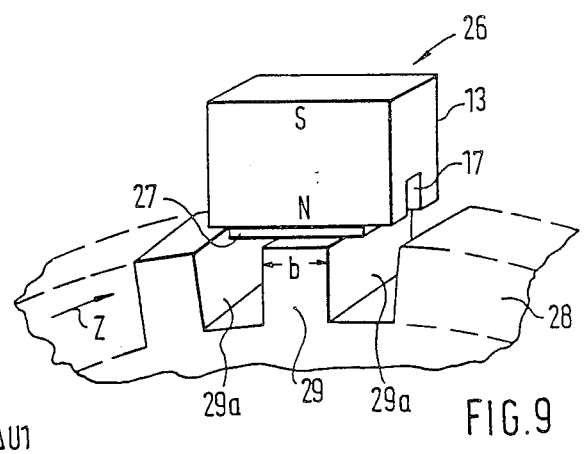
FIG. 9 illustrates the sensor from FIG. 8 in a spatial illustration with a spur gear cooperating therewith in a broken view.
Figure 10:
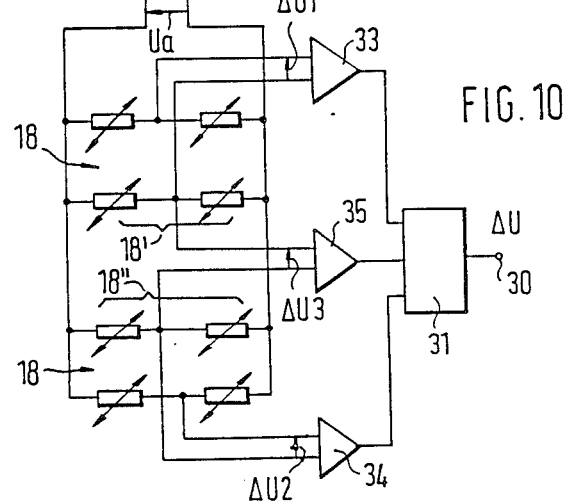
FIG. 10 illustrates the circuit of the measuring strips with the input and output circuit.

A further exemplified embodiment of a sensor 26 in accordance with the invention is illustrated in FIGS. 8 to 10, wherein a substrate 27 is mounted on the lower front face of the stationary mounted permanent magnet 27 on which two bridge circuits 18 are provided in the area of edge 16 of permanent magnet 13. In accordance with FIG. 6 the bridge circuits 18 are formed from a plurality of groups of switched together groups of measuring strips. They are disposed in direction of groove 17 and thereby in direction Z of a rotating spur gear 28 (FIG. 9) in a distance a successively and symmetrically with respect to half of the groove length.

The bridge circuits 18 are mounted at the location where the tangential magnetic field component Ht has a substantial homogeneous field density which is so large that all measuring strips 10 are magnetized up to saturation. Offset voltages are compensated by the arrangement of two bridge circuits 18 which may occur on the bridge diagonals due to resymmetry during the mounting of the substrate 27 on the front face of the permanent magnet 13. If the two measuring voltages are subtracted from each other on the bridge circuits 18, their offset voltages compensate and an output signal $\Delta U = \Delta U1 - \Delta U2$ (FIG. 10) is obtained. If the center distance a of the two bridge circuits 18 is selected about as large as the tooth width b of the spur gear 18 and this in turn as large as the tooth gaps 29a, one obtains during the passing of each tooth 29 on sensor 26 a measuring voltage U at the output 30 of the connecting circuit 31 (FIG. 10) which is about double of the dimension as measuring voltage $\Delta U1$ and $\Delta U2$ on the two bridge circuits. Due to this arrangement manufacturing tolerances can be compensated during the mounting of the substrate 27 on the permanent magnet 13 as well as assembly tolerances during the mounting of the sensor 26 and the spur gear 28.

However, in this arrrangement it could be advantageous that the magnetic field of the permanent magnet 26 has field components at both sides, i.e., toward the ends of the groove 17 being parallel to the groove, so that the tangential field component Ht1 and Ht2 are already somewhat turned on the two bridge circuits 18 already without the spur gear 28 as illustrated in FIG. 8. In order to be able to compensate this unparallelity of the magnetic field H, the circuit illustrated in FIG. 10 is used. A stabilized direct voltage for supplying the two bridge circuits 18 is generated through an input stage 32. The measuring voltage $\Delta U1$ of the first bridge circuit 18 is fed to an operating amplifier 33 and the measuring voltage $\Delta U2$ of the second bridge circuit 18 is fed to a further operation amplifier 34. Furthermore, a further bridge circuit is formed from one each bridge branch 18' and 18" of the two bridge circuits 18, whereby the corresponding bridge branch 18' of the one bridge circuit 18 and the corresponding bridge circuit 18" of the other bridge circuit 18 must be disposed on substrate 27 in the center symmetrically with respect to the half of the groove length. The measuring voltage $\Delta U3$ of this third bridge circuit 18'/18" is finally fed as a further interference dimension to a third operation amplifier 35 for compensating the aforementioned unparallelity of the field. The outputs of the operation amplifiers 33, 34 and 35 are now connected with the connection circuit 31, wherein the measuring voltages $\Delta U1$, $\Delta U2$ and $\Delta U3$ are connected with each other in accordance with the algorithm $\Delta U = \Delta U1 + 2 \cdot \Delta U3 + \Delta U2$ for yielding the measuring voltage $\Delta U$. When using the other possible bridge 18'''/18'''' the algorithm is $\Delta U = \Delta U1 - 2 \cdot \Delta U3 + \Delta U2$. The general equation is: $\Delta U = \Delta U1 + (-1)^k \cdot 2 \cdot \Delta U3 + \Delta U2$, whereby a factor k has to be selected depending on the bridge branches used or in accordance with the polarity of the offset part of voltage $\Delta U3$ with respect to $\Delta U1$ or $\Delta U2$, which in the case of the example is up to 1.2.

The invention is not limited to the illustrated exemplified embodiments since changes are possible in the design of the permanent magnet 13 and the arrangement of the measuring strips 10 as well as in the constructive design and arrangement of a ferromagnetic body which is moved relative to a permanent magnet. However, it is essential that the ferromagnetic material (spur gear) to be detected is magnetized by a strong component of the magnetic field which perpendicularly penetrates through the measuring strips 10 and that the sensor is substantially nonsensitive against interference fields due to the tangential component Hx, that the measuring strips 10 are provided in one area of the magnetic field which has a substantial homogeneous field component Ht in the plane of measuring strips 10 and that the direction of this field component Ht changes due to a relative movement of the magnetic field H by the ferromagnetic body for generating a measuring signal. The ferromagnetic body may also be designed as a permanent magnet. Instead of a spur gear 28 for picking up the speed of machines and the like, a gear rack could be used for measuring a path. Furthermore, the measuring strips 10 may be mounted on a substrate in a different configuration than illustrated in FIG. 6, as long as the field component Ht in the area of the measuring strips 10 has a substantially homogeneous field density in the area of the measuring strips. It is further possible for obtaining short line connections on the evaluation circuit to mount the same on the substrate 27 together with the bridge circuits 18.

We claim:

1. Magnetoresistive sensor for detecting position or speed of a movable ferromagnetic body, comprising at least one stationary magnetoresistive strip arranged in a plane; a stationary source of a constant magnetic field (H) whose main magnetic field component (Hy) extends substantially perpendicularly to the plane of said strip and whose relatively small secondary magnetic field component (Hx) extends in said plane; means for feeding a measuring electric current in one direction through said strip; said ferromagnetic body being movable from a starting position opposite said plane of the strip to produce therein, in combination with said secondary magnetic field component, a measuring magnetic field component (Ht) whose direction varies in dependence on position changes of said ferromagnetic body, thus causing a corresponding change of said measuring electric current.

2. Sensor as defined in claim 1 wherein said ferromagnetic body is arranged in a starting measuring position at which said measuring magnetic field component ($H_t$) includes an angle of about 45° with said one direction of the measuring current, and said at least one magnetoresistive strip is magnetically saturated by said measuring magnetic field component ($H_t$).

3. Sensor as defined in claim 1 wherein said source of stationary magnetic field is a permanent magnet having a front face provided with an elongated groove defining an edge with said front face, said at least one magnetoresistive strip being mounted on a substrate located parallel to said front face opposite said edge, and said ferromagnetic body being movable in the longitudinal direction of said groove.

4. Sensor as defined in claim 3 wherein said substrate with said at least one magnetoresistive strip is spaced apart from said front face of the permanent magnet at a distance of less than 2 mm, and said distance being smaller than a clearance between said measuring strips and said ferromagnetic body.

5. Sensor in accordance with claim 3, wherein the substrate supports a plurality of the magnetoresistive strips and is mounted on the front face of said permanent magnet.

6. Sensor in accordance with claim 4 wherein the edge (16) on the permanent magnet (13) is formed by a groove (17) which extends over the total front face of the permanent magnet (13) in the direction of movement (Z) of the ferromagnetic body (14, 29).

7. Sensor in accordance with claim 6, wherein the ferromagnetic body (14, 29) is formed by a tooth of a rotating gear.

8. Sensor in accordance with claim 5, wherein the magnetoresistive strips (10, 10a) are combined into four branch resistors (19, 19a) of a bridge circuit arranged in four quadrants of a square area (20) of said substrate (12, 12a).

9. Sensor in accordance with claim 8, wherein the measuring magnetic field component ($H_t$) has a substantial homogeneous field density in the area of said resistors (19).

10. Sensor in accordance with claim 9, wherein the branch resistors (19) of said bridge circuit (18) consist of meander like successively disposed magnetoresistive strips (10) which are turned by 90° in their longitudinal direction with respect to the longitudinal directions of the strips of the adjacent branch resistors (19).

11. Sensor in accordance with claim 9, wherein branch resistors (19) of said bridge circuit (18) consist of successively disposed magnetoresistive strips (10a), whose longitudinal directions correspond to the longitudinal directions of the strips of the adjacent branch resistors (19), said strips being separated into path segments (25) by electrically conductive threads (24) which extend at 45° to the longitudinal direction of said strips (10a) and at an angle of 90° to the threads (24) on the strips (10a) of the adjacent resistors (19).

12. Sensor in accordance with claim 5, wherein opposite said edge (16) of the permanent magnet (13) said magnetoresistive strips are connected in two successive bridge circuits (18) arranged on said substrate (27) at a distance (a) with respect to the ferromagnetic body (14, 29).

13. Sensor in accordance with claim 12, wherein a center distance (a) of the two bridge circuits (18) is about equal to the tooth width (b) of a rotating spur gear (28) forming the ferromagnetic body, and whose teeth (29) and teeth gaps (29a) are uniformly wide.

14. Sensor in accordance with claim 12, wherein a bridge branch (18') of a bridge circuit (18) which is disposed opposite a circuit branch (18") of the other bridge circuit (18) is arranged symmetrically to the center of the groove length and are combined into a third bridge circuit (18', 18").

15. Sensor in accordance with claim 14, wherein measuring voltages ($\Delta U1$, $\Delta U2$, $\Delta U3$) are generated in the three bridge circuits and (18, 18', 18") are applied to an evaluation circuit (31) and combined therein into an interference compensating voltage in accordance with an algorithm $\Delta U = \Delta U1 + (-1)^{k} \cdot 2 \Delta U3 + \Delta U2$, wherein k=1,2.

16. Sensor in accordance with 8, wherein opposite said edge (16) of the permanent magnet (13) said magnetoresistive strips are connected in two successive bridge circuits (18) at a distance (a) with respect to the ferromagnetic body.

* * * * *